US012641745B2

(12) United States Patent
Lin

(10) Patent No.: US 12,641,745 B2
(45) Date of Patent: May 26, 2026

(54) LOCKING-UNLOCKING DEVICE AND COMPUTER HAVING LOCKING-UNLOCKING DEVICE

(71) Applicant: Wistron Corporation, New Taipei City (TW)

(72) Inventor: Sheng-Chan Lin, New Taipei City (TW)

(73) Assignee: WISTRON CORPORATION, New Taipei City (TW)

( * ) Notice: Subject to any disclaimer, the term of this patent is extended or adjusted under 35 U.S.C. 154(b) by 127 days.

(21) Appl. No.: 18/910,638

(22) Filed: Oct. 9, 2024

(65) Prior Publication Data

US 2026/0068065 A1 Mar. 5, 2026

(30) Foreign Application Priority Data

Aug. 28, 2024 (TW) ................................. 113132439

(51) Int. Cl.
*H05K 7/14* (2006.01)
*G06F 1/187* (2026.01)
*H05K 5/02* (2006.01)

(52) U.S. Cl.
CPC ......... *H05K 7/1487* (2013.01); *H05K 5/0221* (2013.01); *H05K 5/023* (2013.01); *G06F 1/187* (2013.01)

(58) Field of Classification Search
CPC .. H05K 7/1487; H05K 7/1489; H05K 5/0221; H05K 5/023; G06F 1/1679; G06F 1/187
See application file for complete search history.

(56) References Cited

U.S. PATENT DOCUMENTS

| | | | | |
|---|---|---|---|---|
| 10,168,747 | B2 * | 1/2019 | Zhu | H05K 7/1489 |
| 11,419,229 | B1 * | 8/2022 | An | H05K 7/1489 |
| 2015/0091423 | A1 * | 4/2015 | Fu | H05K 7/1487 |
| | | | | 312/257.1 |
| 2017/0150634 | A1 * | 5/2017 | Huang | H05K 7/1489 |
| 2024/0251513 | A1 * | 7/2024 | Guzman | H05K 5/0221 |
| 2024/0397648 | A1 * | 11/2024 | Yao | H05K 5/0221 |
| 2025/0040074 | A1 * | 1/2025 | Tsorng | H05K 5/0221 |

* cited by examiner

*Primary Examiner* — Nidhi Thaker
(74) *Attorney, Agent, or Firm* — McClure, Qualey & Rodack, LLP

(57) ABSTRACT

A locking-unlocking device includes a fixing member, a stopping member, and a locking-unlocking member. The stopping member includes a first connection part, a movable part, and a stopping part. The movable part is capable of being moved toward a first direction to a limited extent when the movable part is applied with a first external force. The stopping part is normally in the stopping space. The locking-unlocking member includes a second connection part and a locking part. The locking part is capable of being moved toward a second direction to a limited extent when the locking part is applied with a second external force.

20 Claims, 14 Drawing Sheets

FIG. 13A

LOCKING-UNLOCKING DEVICE AND COMPUTER HAVING LOCKING-UNLOCKING DEVICE

CROSS-REFERENCE TO RELATED APPLICATION

This non-provisional application claims priority under 35 U.S.C. § 119(a) to Patent Application No. 113132439 filed in Taiwan, R.O.C. on Aug. 28, 2024, the entire contents of which are hereby incorporated by reference.

BACKGROUND

Technical Field

The instant disclosure relates to a locking-unlocking device, especially to a locking-unlocking device which is adapted to be utilized, for example, server-type computers, and the instant disclosure also relates to a computer having the locking-unlocking device.

Related Art

As time moves on, applications of server-type computers become wider and wider, from private and individual purposes to enterprise and business adoptions, and further to applications in brands, total solutions, data centers, and so forth. Based on functions of the server-type computers, the server-type computers can be further divided into different application demands, such as storage, computation, networking communication, backup, security, or the like. Consequently, because of the diverse applications of the server-type computers, how to develop and plan the server specifications and how to conduct product planning with a minimum development configuration have become issues for the server brand companies.

Recently, in the developments of some server products, the server is divided into a front part and a rear part, namely, "the base module and the front module". For the configuration of the front module known to the inventor, a hard disk combination installed with hard disks is usually lifted upwards with an inclination angle using a handle, so that the assembling and disassembling of the hard disk combination can be performed conveniently. Therefore, the server product needs to be provided with stable and robust structures to load the weight of the hard disk combination. Nevertheless, when the assembling of the base module and the front module is not completed, the semi-product may not have sufficient robustness, at this time, if the hard disk combination is lifted upwards improperly, the structure of the server product may be deformed or damaged.

SUMMARY

In order to address the above issues, some embodiments of the instant disclosure provide a locking-unlocking device. Therefore, according to the locking-unlocking device of one or some embodiments of the instant disclosure, before the assembling of the server product is completed, the locking-unlocking device can prevent the hard disk combination in the server product from being improperly operated. Or, according to the locking-unlocking device of one or some embodiments of the instant disclosure, before an operation is completed, the locking-unlocking device can effectively pause the operation of another operation. Accordingly, the issues mentioned above can be improved properly.

According to some embodiments of the instant disclosure, a locking-unlocking device comprises a fixing member, a stopping member, and a locking-unlocking member. The stopping member comprises a first connection part, a movable part, and a stopping part. At least one end of the first connection part is connected to the fixing member. At least one end of the movable part is connected to the first connection part, and the movable part is capable of being moved toward a first direction to a limited extent when the movable part is applied with a first external force. At least one end of the stopping part is connected to the movable part, and the stopping part is normally in the stopping space. When the movable part is applied with the first external force to be moved toward the first direction, the stopping part leaves the stopping space. The locking-unlocking member comprises a second connection part and a locking part. At least one of two ends of the second connection part is connected to the fixing member. At least one end of the locking part is connected to the other end of the second connection part. The locking part is capable of being moved toward a second direction to a limited extent when the locking part is applied with a second external force. When the stopping part is in the stopping space, the locking-unlocking member is blocked by the stopping part and not capable of being moved toward the second direction to enter the stopping space. When the stopping part leaves the stopping space, the locking-unlocking member is capable of being moved toward the second direction to enter the stopping space.

According to some embodiments of the instant disclosure, a computer comprises a chassis, a functional device, and a locking-unlocking device. The functional device is accommodated in the chassis and comprises a releasing member. The releasing member is capable of being operated, and the releasing member is at least capable of being slid to a locked position or a released position. The locking-unlocking device is directly or indirectly arranged at a portion of the chassis adjacent to the releasing member and comprises a fixing member, a stopping member, and a locking-unlocking member. The fixing member is directly or indirectly fixed on the chassis. The stopping member comprises a movable part and a stopping part. At least one end of the stopping part is connected to the movable part, and the stopping part is normally in a stopping space. When the movable part is applied with a first external force to be moved toward a first direction, the stopping part leaves the stopping space. The locking-unlocking member comprises a locking part. The locking part is capable of being moved toward a second direction when the locking part is applied with a second external force, the locking part is normally interfered with a movement path of the releasing member from the locked position to the released position. When the stopping part of the stopping member is applied with the first external force to leave the stopping space, the locking part is capable of being moved toward the second direction, so that the locking part is no longer interfered with the movement path of the releasing member to allow the locking-unlocking member to enter the stopping space, thereby allowing the releasing member to be capable of being operated and to be slid from the locked position to the released position.

Based on the above, according to the locking-unlocking device of one or some embodiments of the instant disclosure, when the assembling of the server product is not completed, the locking-unlocking device can prevent the hard disk combination in the server product from being improperly operated. Or, according to the locking-unlocking device of one or some embodiments of the instant disclosure, before an operation is completed, the locking-unlocking device can effectively pause the operation of another operation, thereby improving current encountering technical issues. In some embodiments, the locking-unlocking device is integrally formed as a unitary member, so that the development and manufacturing costs of the components of the locking-unlocking device can be reduced. Moreover, the locking-unlocking device is a lightweight and tiny structure which can prevent the improper operation of the hard disk combination without adjusting or changing the configuration of the server structure.

The objective, technologies, features, and advantages of the instant disclosure will become apparent from the following description in conjunction with the accompanying drawings wherein certain embodiments of the instant disclosure are set forth by way of illustration and example.

BRIEF DESCRIPTION OF THE DRAWINGS

The instant disclosure will become more fully understood from the detailed description given herein below for illustration only and therefore not limitative of the instant disclosure, wherein:

FIG. 13A illustrates a partial exploded view of a computer comprising the locking-unlocking device of the second embodiment, where the base module and the separation member are illustrated separately;

DETAILED DESCRIPTION

Figure 1:
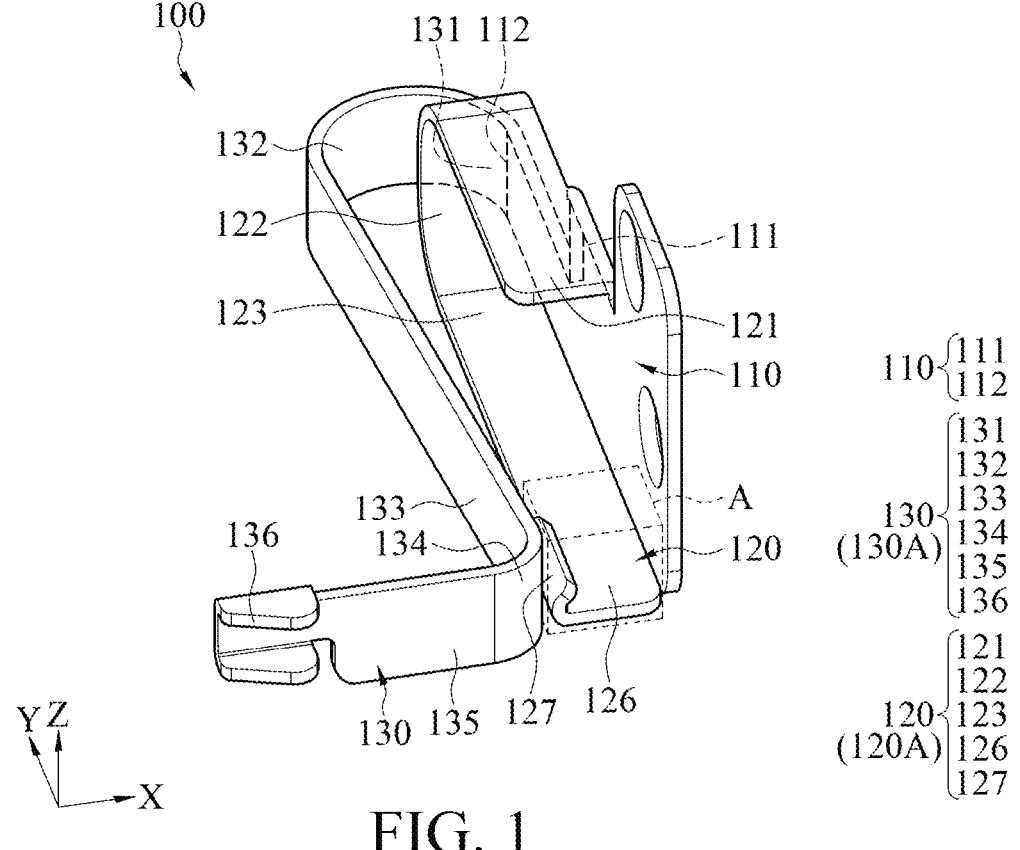
FIG. 1 illustrates a perspective view of a locking-unlocking device according to a first embodiment.

Embodiments of the instant disclosure will be described in detail below with reference to the accompanying drawings. In the descriptions of this specification, many specific details are provided to provide a thorough understanding of the instant disclosure. However, the instant disclosure may still be implemented without some or all of the specific details. Identical or similar elements in the drawings will be denoted by identical or similar symbols. It should be noted that the accompanying drawings are only provided for illustrative purposes, and do not represent the actual size or quantity of components. Furthermore, some details may not be completely drawn for brevity of the accompanying drawings.

Figure 2:
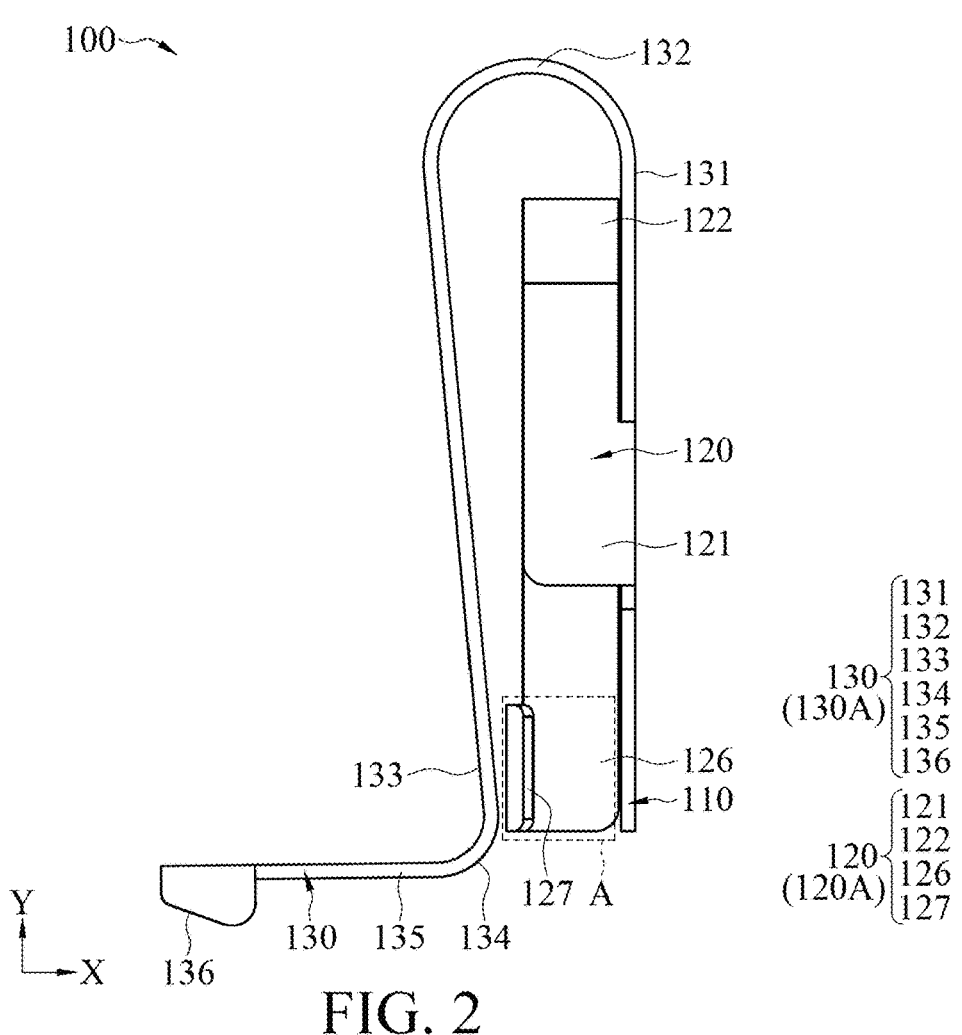
FIG. 2 illustrates a top view of the locking-unlocking device of the first embodiment.
Figure 3:
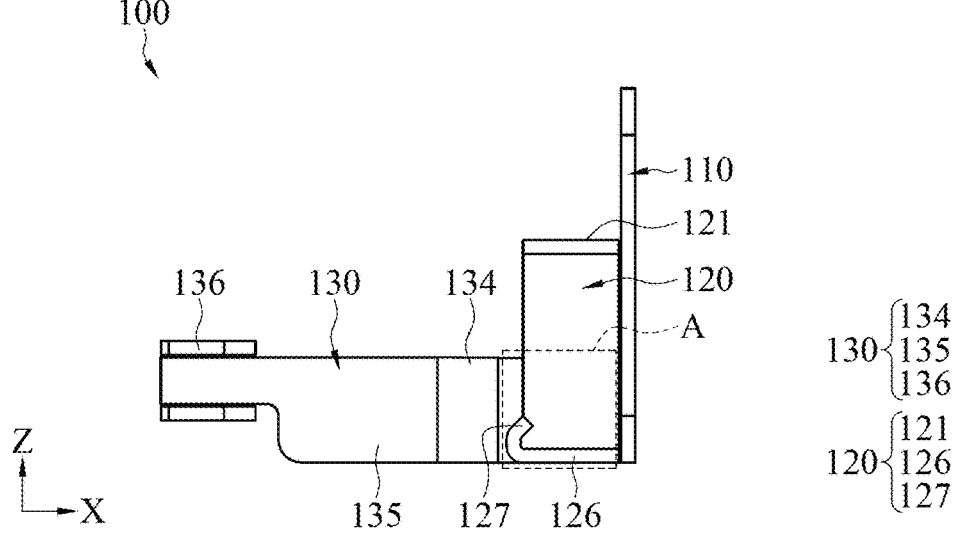
FIG. 3 illustrates a front side view of the locking-unlocking device of the first embodiment.

Please refer to FIG. 1 to FIG. 3. FIG. 1 to FIG. 3 illustrate a locking-unlocking device 100 according to a first embodiment. The locking-unlocking device 100 comprises a fixing member 100, a stopping member 120, and a locking-unlocking member 130. The stopping member 120 comprises a first connection part 121, a movable part 123, and a stopping part 126. The stopping member 120 is connected to the fixing member 110 through at least one end of the first connection part 121. At least one end of the movable part 123 is connected to the first connection part 121. At least one end of the stopping part 126 is connected to the movable part 123. The locking-unlocking member 130 comprises a second connection part 131 and a locking part 135. The locking-unlocking member 130 is connected to the fixing member 110 through at least one of two ends of the second connection part 131. At least one end of the locking part 135 is connected to the other end of the second connection part 131. The movable part 123 is capable of being moved toward a first direction (for example, the –Z direction shown in this embodiment) in a limited extent when the movable part 123 is applied with a first external force, and the locking part 135 is capable of being moved toward a second direction (for example, the +X direction shown in this embodiment) in a limited extent when the locking part 135 is applied with a second external force. The stopping part 126 is normally in a stopping space A. When the movable part 123 is applied with the first external force to be moved toward the first direction, the stopping part 126 leaves the stopping space A. When the stopping part 126 is in the stopping space A, the locking-unlocking member 130 is blocked by the stopping part 126 and not capable of being moved toward the second direction to enter the stopping space A; when the stopping part 126 leaves the stopping space A, the locking-unlocking member 130 is capable of being moved toward the second direction to enter the stopping space A.

Specifically, according to some embodiments, under a normal state, the stopping part 126 is in the stopping space A. Under this configuration, even though the locking-unlocking member 130 is applied with the force toward the +X direction and thus tends to be moved toward the +X direction, because the locking-unlocking member 130 is blocked by the stopping part 126 in the stopping space A, the locking-unlocking member 130 is eventually not capable of being moved toward the +X direction to enter the stopping space A. When the movable part 123 is applied with the force toward –Z direction (for example, a force is applied on a portion of the movable part 123 adjacent to the stopping part 126), the stopping part 126 leaves the stopping space A along the –Z direction. Under this configuration, when the locking-unlocking member 130 is applied with the force toward +X direction, the locking-unlocking member 130 is capable of being moved toward the +X direction to allow a portion of the locking-unlocking member 130 to be in the stopping space A. Accordingly, in an application scenario, the locking-unlocking device 100 is adapted to be applied to a computer 200 having a base module 230 and a front module 240 (also refer to FIG. 13A). When the assembling of the base module 230 and the front module 240 is not completed, the locking-unlocking member 130 of the locking-unlocking device 100 is capable of locking the functional device 240A of the front module 240 to allow the functional device 240A to be under a locked state, and the stopping part 126 of the stopping member 120 is in the stopping space A to block the movement of the locking-unlocking member 130. Therefore, the functional device 240A can be prevented from being operated improperly; when the locked state of the functional device 240A is not released, the functional device 240A is not capable of being operated. When the assembling of the base module 230 and the front module 240 is completed, the movable part 123 is pressed downwards, so that the locking-unlocking member 130 can be actuated and moved to release the locked state of the functional device 240A, thereby allowing the functional device 240A to be capable of being operated (which will be illustrated in detail in FIG. 13A to FIG. 20 later). Accordingly, the locking-unlocking device 100 can prevent the improper operation of the computer 200 when the assembling of the computer 200 is not completed in which the improper operation of the computer 200 will cause deformation or other irreversible damages to the structure of the computer 200.

In some embodiments, the locking-unlocking device 100 of the instant disclosure may be integrally formed as a unitary member; in some other embodiments, the fixing member 110, the stopping member 120, and the locking-unlocking member 130 are three components assembled with each other to form the locking-unlocking device 100; in some other embodiments, any two of the fixing member 110, the stopping member 120, and the locking-unlocking member 130 may be integrally formed as a unitary member, and the unitary member is assembled with the rest component to form the locking-unlocking device 100.

In some embodiments, the fixing member 100 may be a sheet-shaped structure, a strip-shaped, or a bar-shaped structure to provide supporting and fixing functions. That is, in some embodiments, when the locking-unlocking device 100 is assembled in the computer 200, the locking-unlocking device 100 is fixed on the chassis 210 of the computer 200 through the fixing member 110 to support the operations of the stopping member 120 and the locking-unlocking member 130. Please refer to FIG. 1 to FIG. 3. In this embodiment, the fixing member 100 is a sheet-shaped structure.

In some embodiments, the fixing member 110 has a first edge 111 and a second edge 112, the first connection part 121 is connected to the first edge 111, and the second connection part 131 is connected to the second edge 112.

Please refer to FIG. 1 to FIG. 3. In some embodiments, the stopping member 120 is a first cantilever element 120A configured to be strip-shaped; that is, in some embodiments, one of two ends of the first cantilever element 120A (the fixed end of the first cantilever element 120A) is the first connection part 121 connected to the fixing member 110, the other end of the first cantilever element 120A (the free end of the first cantilever element 120A) is the stopping part 126 configured to be suspended, and the movable part 123 is at the middle section of the first cantilever element 120A. Specifically, in some embodiments, the middle section of the first cantilever element 120A is defined as the position between the first connection part 121 and the stopping part 126. In other words, in some embodiments, the first connection part 121, the movable part 123, and the stopping part 126 are sequentially connected to each other.

In some embodiments, a side portion of the stopping part 126 further comprises a first protrusion part 127, and the first protrusion part 127 is at least one portion of the side surface of the stopping part 126. For example, the first protrusion part 127 is at the side surface of the stopping part 126 away from the fixing member 110, and the first protrusion part 127 is adjacent to the locking-unlocking member 130. Accordingly, under the normal state, the first protrusion part 127 provides a larger surface to block the locking-unlocking member 130 from entering the stopping space A (to prevent the locking-unlocking member 130 from being moved toward the +X direction).

In some embodiments, the first cantilever element 120A (an embodiment of the stopping member 120) further comprises a first bent part 122, and the first bent part 122 is between the first connection part 121 and the movable part 123. Accordingly, the bent configuration of the first bent part 122 provides the swing range for the stopping part 126 in a vertical direction (the Z direction) when the movable part 123 is pressed. The stopping member 120 is a deformable and flexible strip-shaped cantilever element structure.

Please refer to FIG. 1 to FIG. 3 again. In some embodiments, the locking-unlocking member 130 is a second cantilever element 130A configured to be strip-shaped, one of two ends of the second cantilever element 130A (the fixed end of the second cantilever element 130A) is the second connection part 131 connected to the fixing member 110, and the other end of the second cantilever element 130A (the free end of the second cantilever element 130A) is the locking part 135 configured to be suspended.

In some embodiments, the locking-unlocking member 130 further comprises a second bent part 132, and the second bent part 132 is between the second connection part 131 and the locking part 135. Accordingly, the bent configuration of the second bent part 132 provides the swing range for at least one portion of the locking-unlocking member 130 in a horizontal direction (the X direction). Moreover, the second bent part 132 allows the locking-unlocking member 130 to enclose the movable part 123 and the stopping part 126 of the stopping member 120 substantially, and the second bent part 132 also allows the locking part 135 to be located out of the stopping part 126 (that is, the locking part 135 is at one side of the stopping part 126 opposite to the fixing member 110). The locking-unlocking member 130 is a deformable and flexible strip-shaped cantilever element structure.

In some embodiments, the locking-unlocking member 130 further comprises an interference section 133, and the interference section 133 is between the second bent part 132 and the locking part 135. When the stopping part 126 leaves the stopping space A, the interference section 133 of the locking-unlocking member 130 is capable of being moved toward the second direction (for example, the +X direction shown in this embodiment) flexibly to enter the stopping space A.

In some embodiments, the locking-unlocking member 130 further comprises a third bent part 134, and the third bent part 134 is between the interference section 133 and the locking part 135.

In some embodiments, the locking part 135 has a guiding part 136 at the free end of the locking part 135 (the end of the locking part 135 not connected to the second connection part 131). Accordingly, when the guiding part 136 is applied with an external force toward the +Y direction, the guiding part 136 is capable of guiding the locking part 135 to be moved toward the +X direction. In this embodiment, the guiding part 136 is configured to be two guiding bevels.

Please refer to FIG. 1 to FIG. 3. In this embodiment, the stopping member 120 is the first cantilever element 120A, and the locking-unlocking member 130 is the second cantilever element 130A. A main plane of the first connection part 121 of the stopping member 120 is substantially perpendicular to a main plane of the fixing member 110, and a main plane of the stopping part 126 is substantially perpendicular to the main plane of the fixing member 100 and substantially parallel to the main plane of the first connection part 121.

Figure 4:
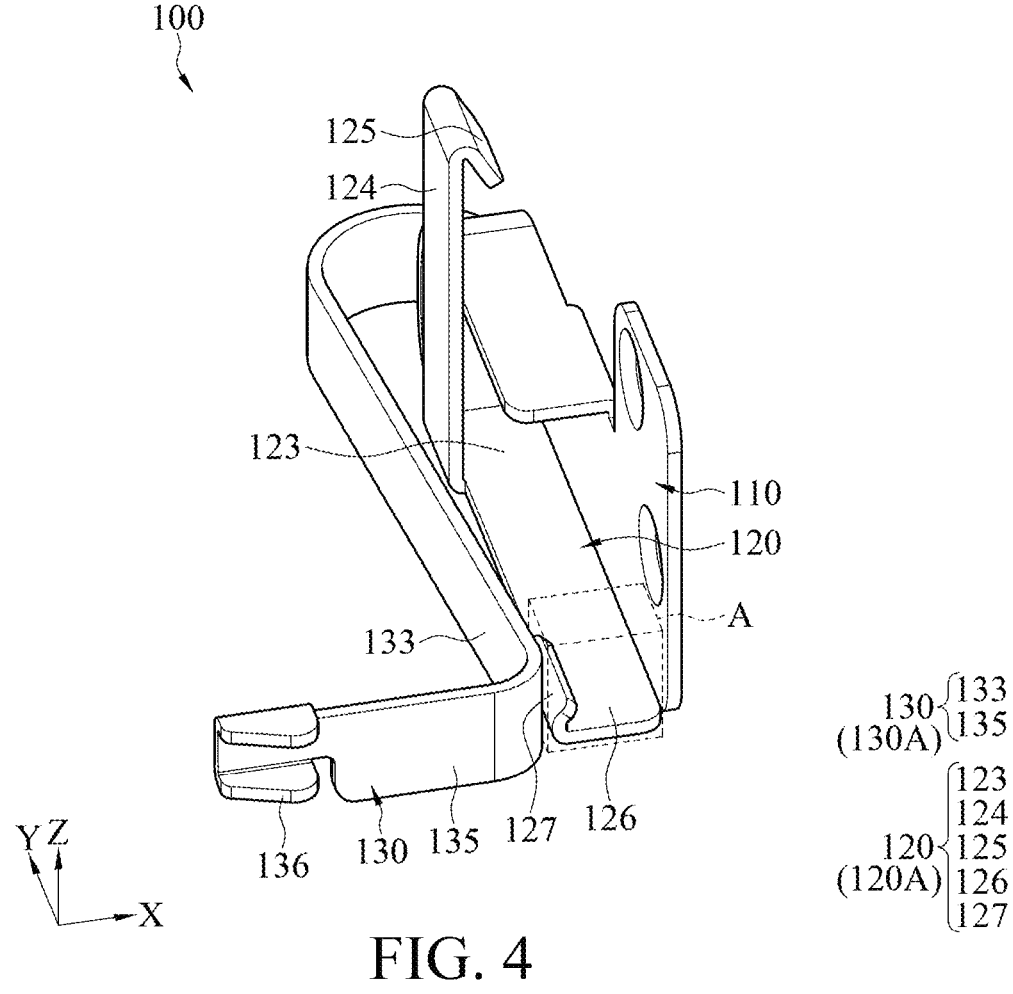
FIG. 4 illustrates a perspective view of a locking-unlocking device according to a second embodiment, where the locking-unlocking device is under a normal state.
Figure 5:
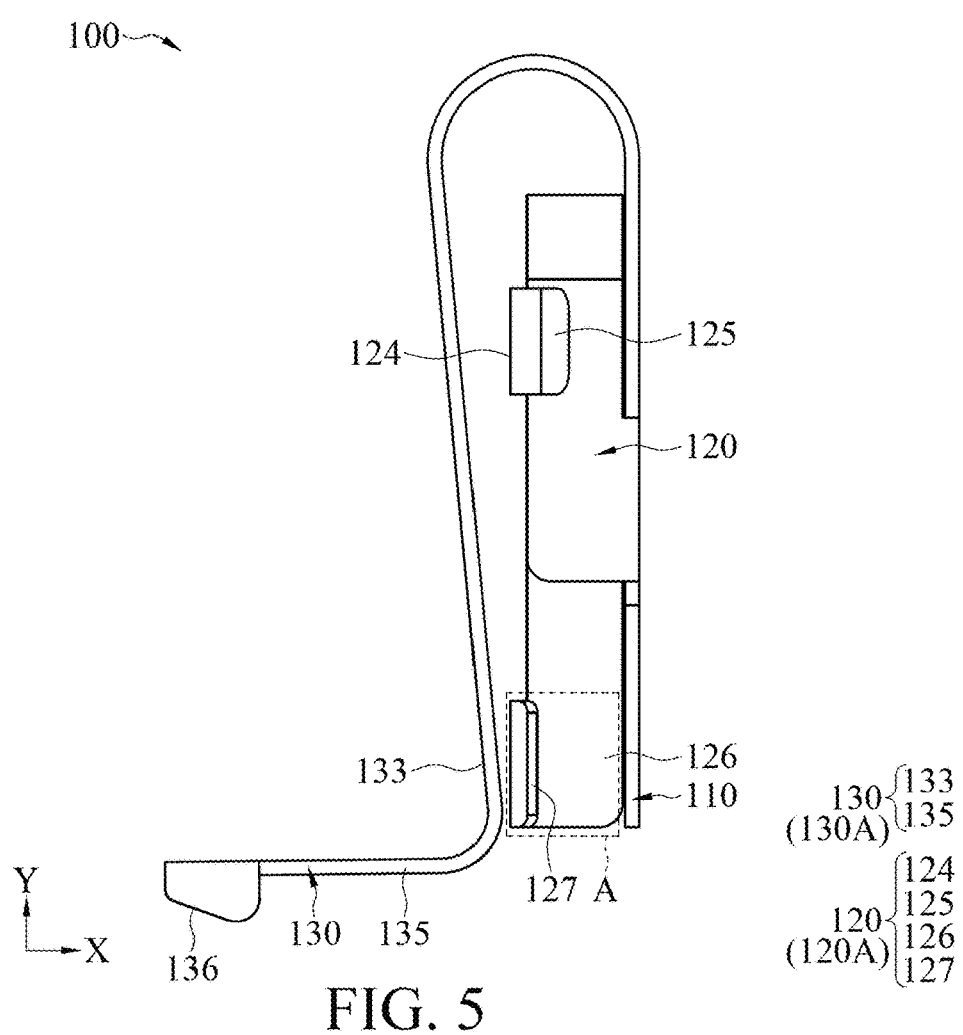
FIG. 5 illustrates a top view of the locking-unlocking device of the second embodiment, where the locking-unlocking device is under the normal state.
Figure 6:
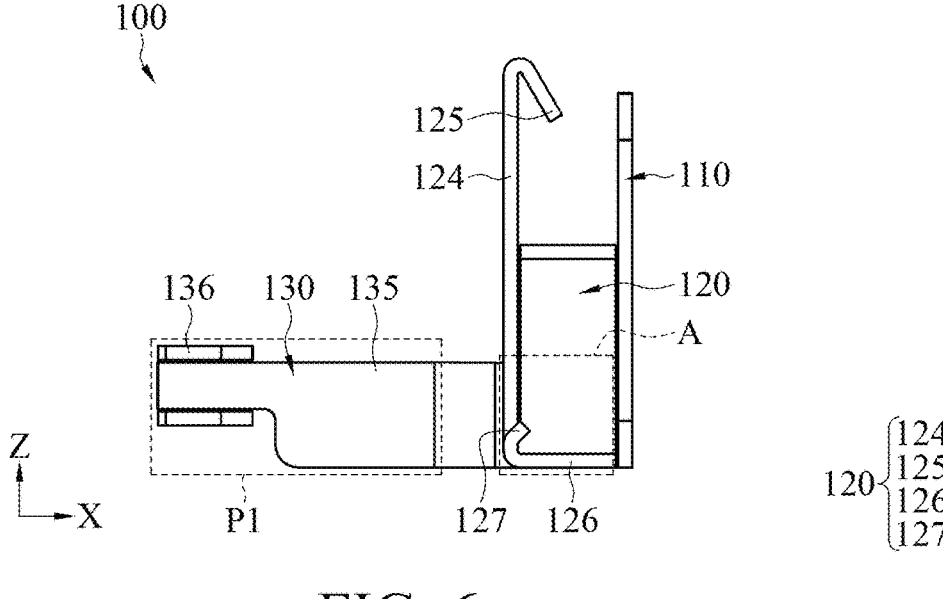
FIG. 6 illustrates a front side view of the locking-unlocking device of the second embodiment, where the locking-unlocking device is under the normal state.

Please refer to FIG. 4 to FIG. 6. FIG. 4 to FIG. 6 illustrate a locking-unlocking device 100 according to a second embodiment. In some embodiments, the stopping member 120 further comprises a second protrusion part 124 outwards protruding from the movable part 123. For example, one of two ends of the second protrusion part 124 (the fixed end of the second protrusion part 124) is connected to the side surface of the middle section of the first cantilever element 120A (one side of the first cantilever element 120A away from the fixing member 110), the second protrusion part 124 extends along the +Z direction, and one end of the second protrusion part 124 protrudes outwards from the first connection part 121 by a certain height. In this embodiment, the movable part 123 is the middle section of the first cantilever element 120A extending along the Y direction, and the second protrusion part 124 is a structure extending along the Z direction. Therefore, in the second embodiment, when an external force is downwards applied to the first cantilever element 120A, the external force may be firstly applied to the second protrusion part 124 which has a higher extent of protrusion as compared with other parts of the first cantilever element 120A and then the external force is indirectly applied to the movable part 123. Therefore, the mechanism of the locking-unlocking device 100 of the second embodiment is different from the mechanism of the locking-unlocking device 100 of the first embodiment; in the first embodiment, when the external force is applied to the first cantilever element 120A, the external force is directly applied to the movable part 123.

In some embodiments, the free end of the second protrusion part 124 (the end of the second protrusion part 124 not connected to the middle section of the first cantilever element 120A) has a guiding inclined surface 125. Accordingly, in the case that the external force is not completely directed toward the −Z direction but has a part of a component force of the external force directed toward the −X direction, the movable part 123 is still capable of being moved toward the −Z direction through the guiding inclined surface 125, thereby driving the stopping part 126 to leave the stopping space A along the −Z direction. In some embodiments, an extension direction of the second protrusion part 124 is substantially parallel to the main plane of the fixing member 110 and is substantially perpendicular to the main plane of the first connection part 121 and the main plane of the stopping part 126 (which will be illustrated in detail in FIG. 4 to FIG. 6 later).

Next, please refer to FIG. 4 to FIG. 12. In the following paragraphs, the operation of the locking-unlocking device 100 according to the second embodiment is used to illustrate the locked state and the unlocked state of the locking-unlocking device 100.

Please refer to FIG. 4 to FIG. 6. The locked state of the locking-unlocking device 100 is the normal state. Under the normal state, the stopping part 126 is in the stopping space A, and the locking part 135 is at a first position P1 (for example, the position of the locking part 135 shown in FIG. 4 to FIG. 6). Under this state, the locking-unlocking member 130 does not enter the stopping space A (that is, the locking-unlocking member 130 is not in the stopping space A). Even though the locking-unlocking member 130 is applied with the force toward the +X direction, the locking-unlocking member 130 is still not capable of entering the stopping space A. Specifically, because the locking-unlocking member 130 is blocked by the stopping part 126, the interference section 133 of the locking-unlocking member 130 is not capable of entering the stopping space A. In some embodiments, the side surface of the stopping part 126 (one side of the stopping part 126 adjacent to the fixing member 110) is moved close to or leans against the fixing member 100. Therefore, even though the stopping part 126 is applied with the force toward the +X direction, the stopping part 126 is still not capable of being moved toward the fixing member 110 (in FIG. 5 and FIG. 6, the direction is the +X direction, rightward direction). Likewise, when the stopping part 126 remains in the stopping space A, the locking-unlocking member 130 is moved close to or leans against the other side surface of the stopping part 126 (one side of the stopping part 126 away from the fixing member 110). Therefore, even though the locking-unlocking member 130 is applied with the force toward the +X direction, the locking-unlocking member 130 is still not capable of being moved toward the fixing member 110. In some embodiments, the locking-unlocking member 130 is moved close to or leans against the first protrusion part 127 and is not capable of being moved toward the fixing member 110.

Figure 7:
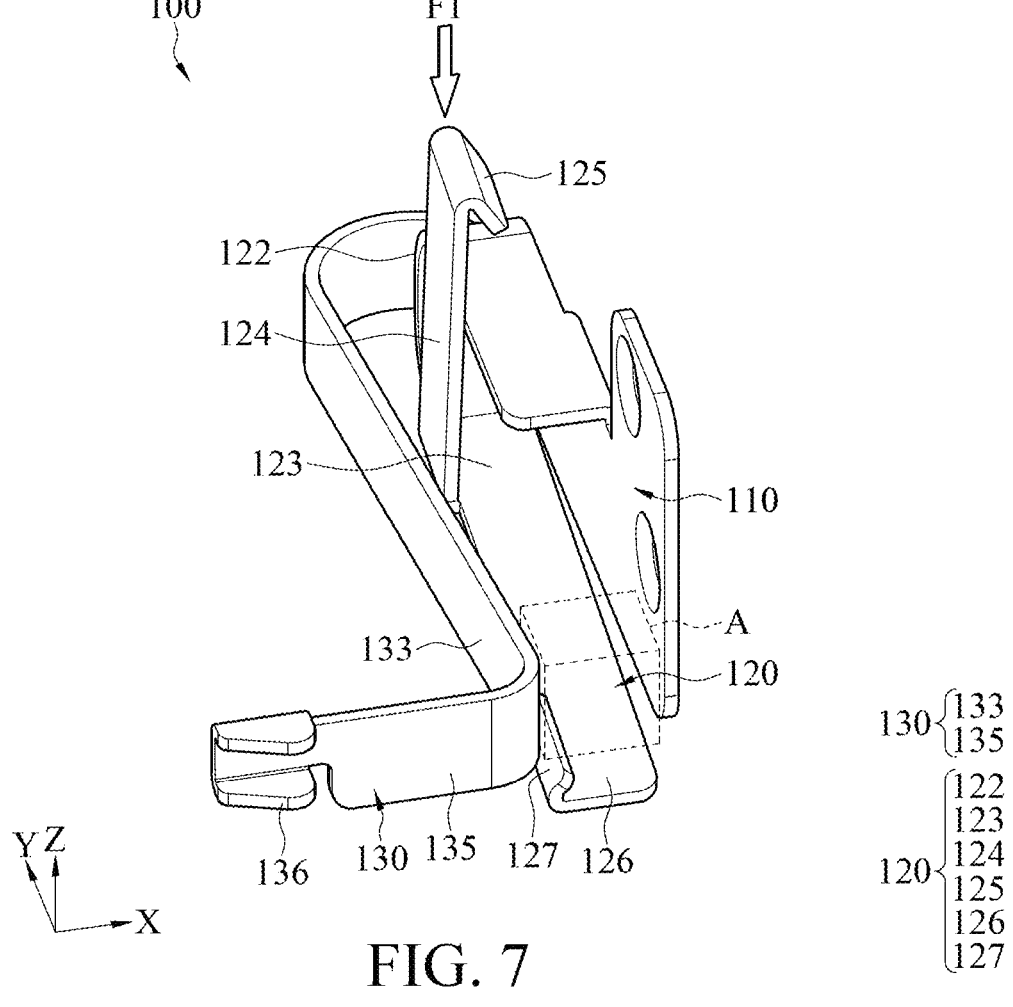
FIG. 7 illustrates a perspective view of the locking-unlocking device of the second embodiment, where the locking-unlocking device is entering an unlocked state.
Figures 8, 9:
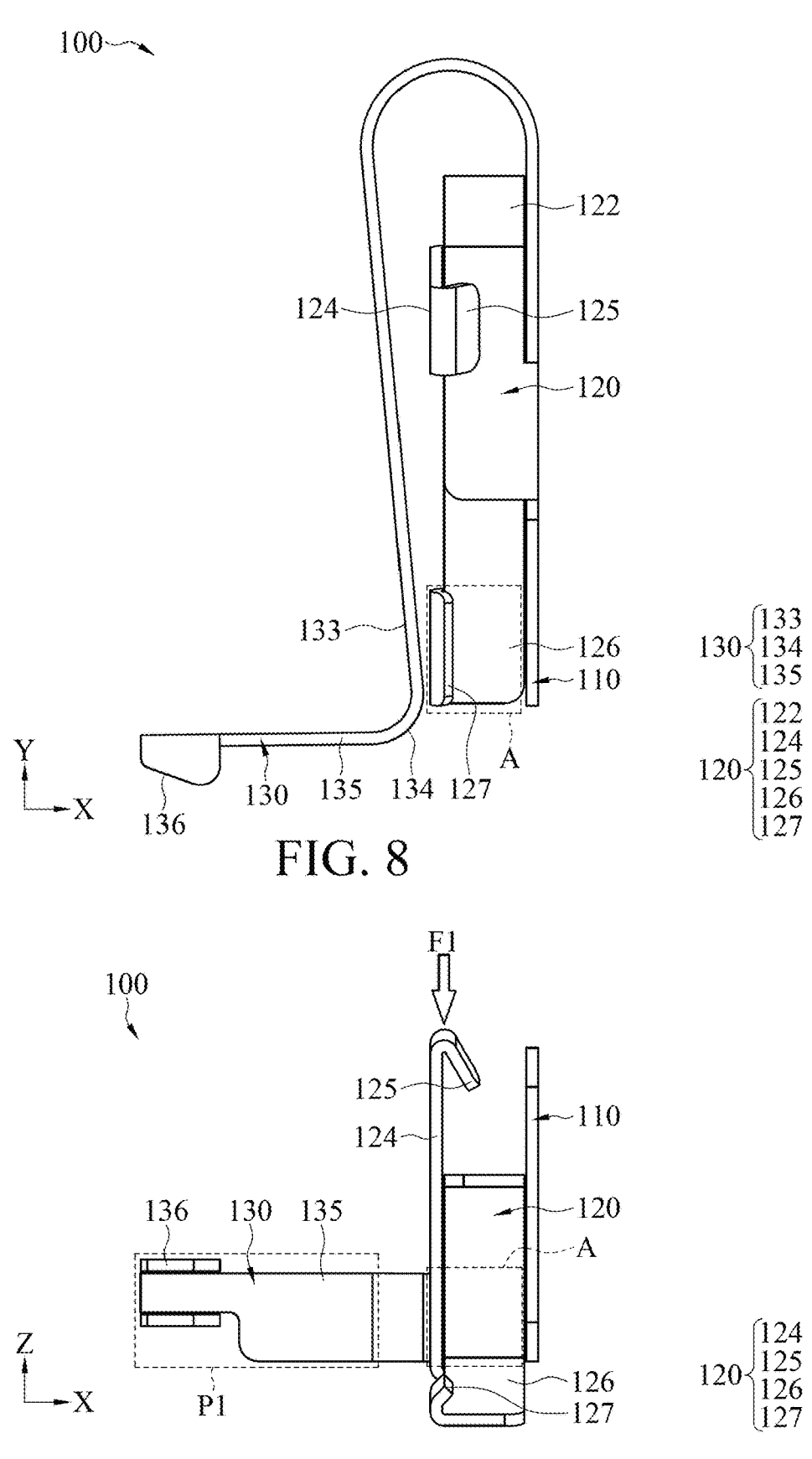
FIG. 8 illustrates a top view of the locking-unlocking device of the second embodiment, where the locking-unlocking device is entering the unlocked state.
FIG. 9 illustrates a front side view of the locking-unlocking device of the second embodiment, where the locking-unlocking device is entering the unlocked state.

Please refer to FIG. 7 to FIG. 9. When the movable part 123 is pressed, the stopping part 126 leaves the stopping space A to allow the locking-unlocking device 100 to be entering an unlocked state. In some embodiments, the first protrusion part 127 also leaves the stopping space A. In some embodiments, the movable part 123 is applied with an external force F1 to be pressed toward the −Z direction (in FIG. 9, downward direction) and moved toward the −Z direction, and the movable part 123 thus drives the stopping part 126 to be moved toward the −Z direction, thereby allowing the stopping part 126 to leave the stopping space A. In some embodiments, the guiding inclined surface 125 of the second protrusion part 124 is applied with an external force F1 to be pressed toward the −Z direction and moved toward the −Z direction, and the guiding inclined surface 125 of the second protrusion part 124 thus drives the movable part 123 and the stopping part 126 to be moved toward the −Z direction, thereby allowing the stopping part 126 to leave the stopping space A. The bent configuration of the first bent part 122 allows the movable part 123 to be moved flexibly and further provides the movement extent for the stopping part 126 when the movable part 123 is pressed.

Figure 10:
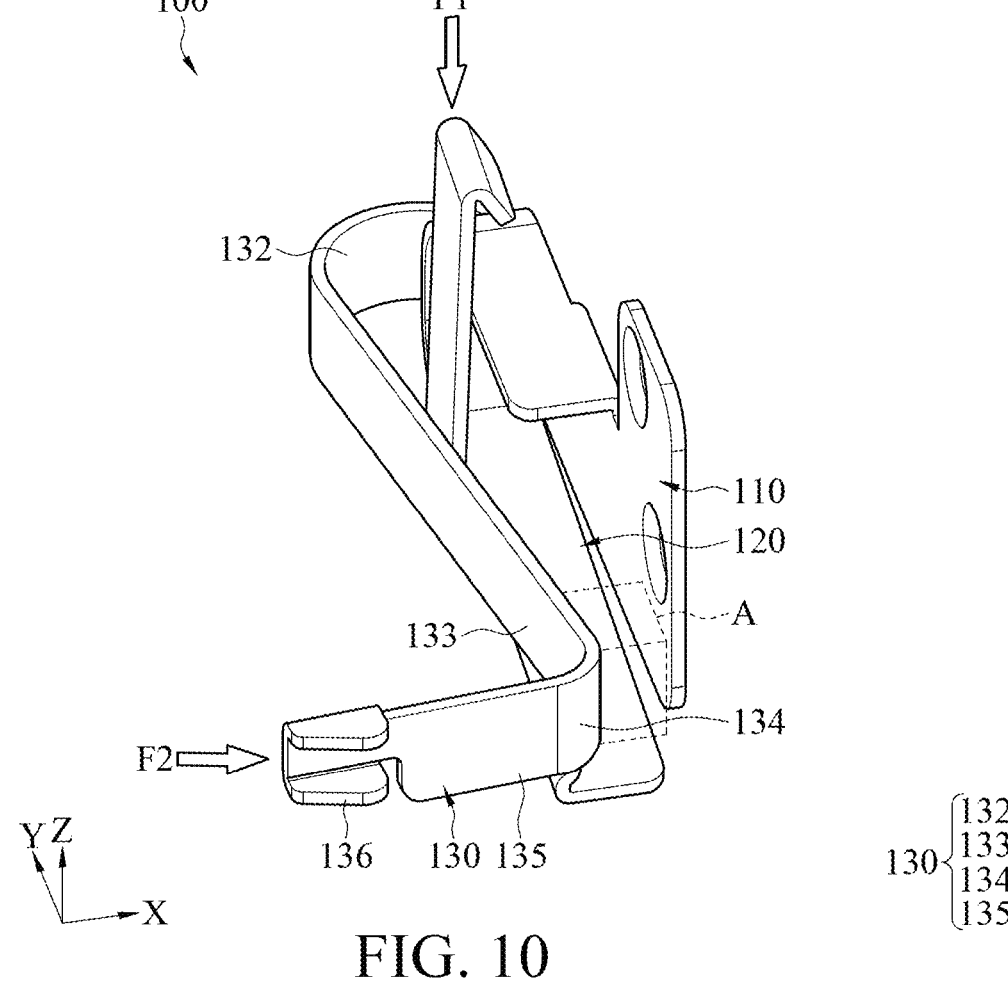
FIG. 10 illustrates a perspective view of the locking-unlocking device of the second embodiment, where the locking-unlocking device is under the unlocked state.
Figures 11, 12:
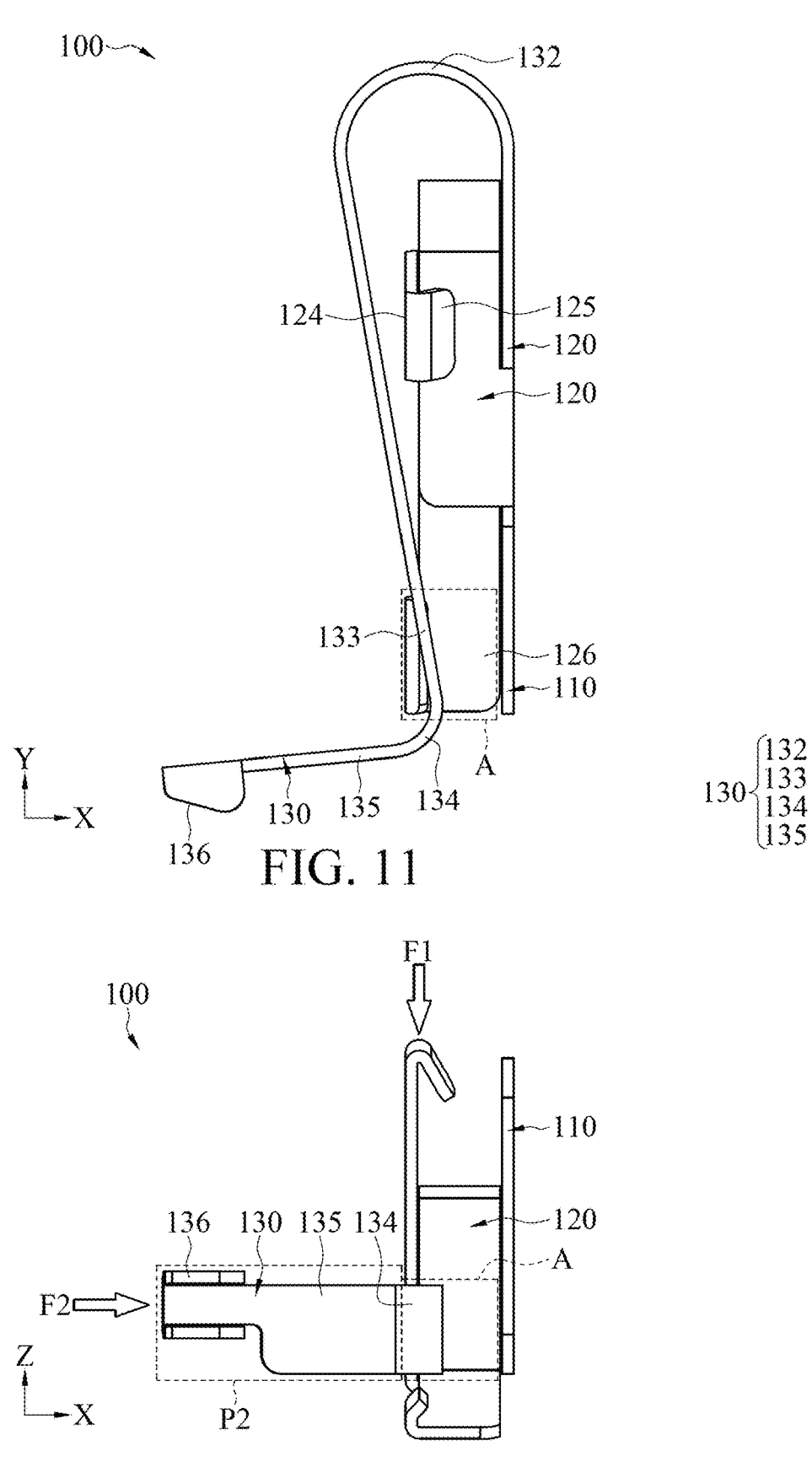
FIG. 11 illustrates a top view of the locking-unlocking device of the second embodiment, where the locking-unlocking device is under the unlocked state.
FIG. 12 illustrates a front side view of the locking-unlocking device of the second embodiment, where the locking-unlocking device is under the unlocked state.

Please refer to FIG. 10 to FIG. 12. When the locking-unlocking device 100 is under the unlocked state, the locking part 135 is capable of being moved from the first position P1 to a second position P2 (for example, the position of the locking part 135 shown in FIG. 10 to FIG. 12). Under this state, at least one portion of the locking-unlocking member 130 is capable of entering the stopping space A. In some embodiments, the locking part 135 is applied with an external force F2 to be pressed toward the +X direction (in FIG. 12, rightward direction) and moved toward the +X direction, and the locking part 135 thus is moved to the second position P2 and allows at least one portion of the locking-unlocking member 130 to be in the stopping space A. In some embodiments, the locking part 135 is capable of driving the interference section 133 to be moved toward the +X direction, and when the locking part 135 is at the second position P2, the interference section 133 is in the stopping space A. In some embodiments, when the locking part 135 is at the second position P2, at least one portion of the third bent part 134 is also in the stopping space A. In some embodiments, when the locking-unlocking device 100 is under the unlocked state, at least one portion of the locking-unlocking member 130 is capable of being moved toward the fixing member 110 (in FIG. 11 and FIG. 12, the direction is the +X direction, rightward direction). The bent configuration of the second bent part 132 provides the movement extent for the interference section 133.

The stopping space A is the region in which the stopping part 126 and the locking-unlocking member 130 are interfered with each other during the movements of the stopping part 126 and the locking-unlocking member 130. In some embodiments, the height of the stopping space A along the Z axis is substantially the width of the interference section 133 along the Z axis, and the width of the stopping space A along the X axis is substantially the width of the stopping part 126 along the X axis.

In some embodiments, when the external force F1 applied to the movable part 123 is removed, the locking-unlocking device 100 is capable of being recovered to the locked state flexibly.

In the following paragraphs, a scenario explaining how to apply the locking-unlocking device 100 in a server-type computer is provided to describe the effect of the locking-unlocking device 100 exemplarily, for example, a computer 200 comprising the locking-unlocking device 100 will be described. Please refer to FIG. 13A and FIG. 13B. In this embodiment, the locking-unlocking device 100 included in the computer 200 is taken the locking-unlocking device 100 of the second embodiment as an example.

Figure 13A:
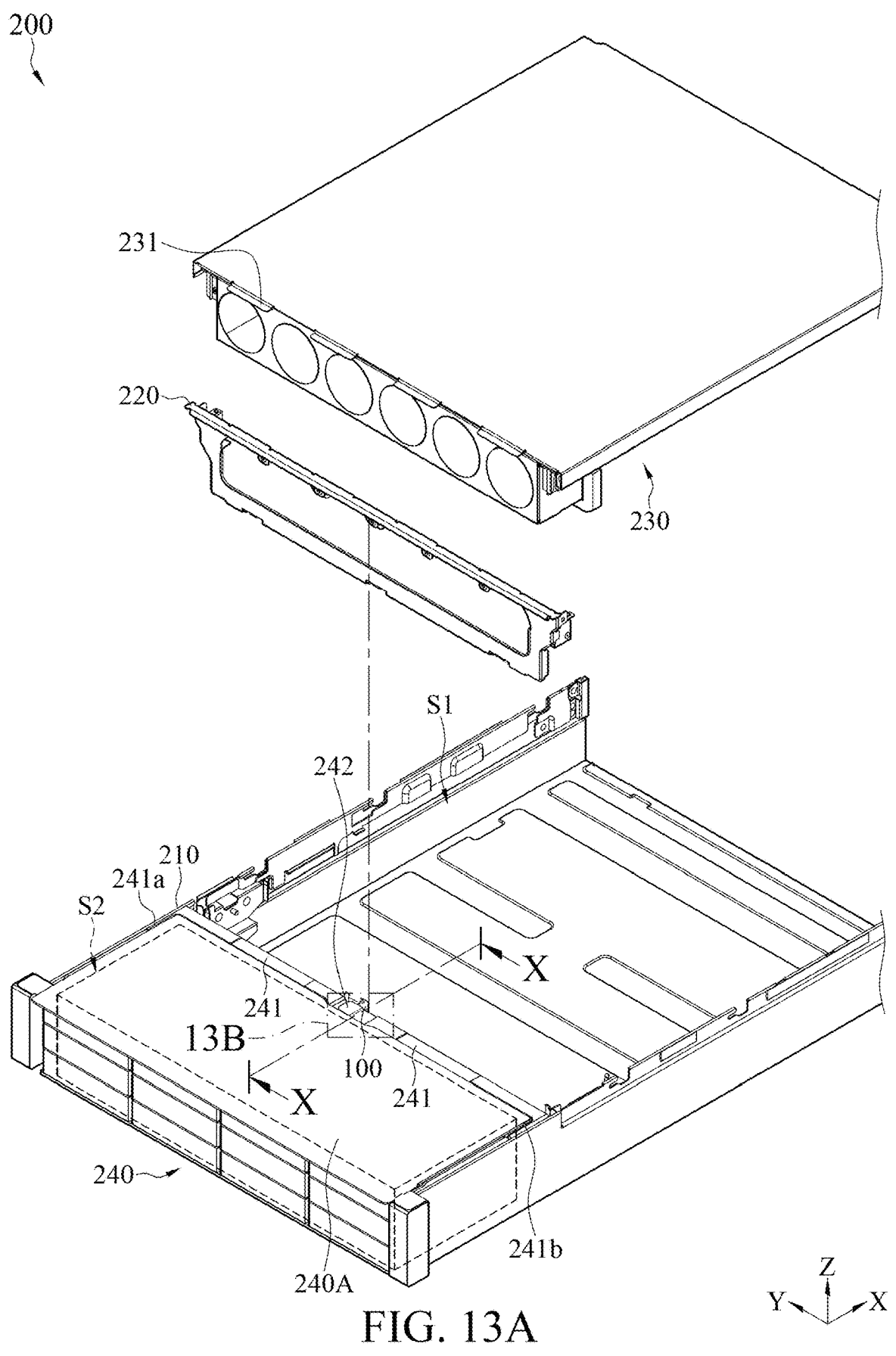
Figure 13B:
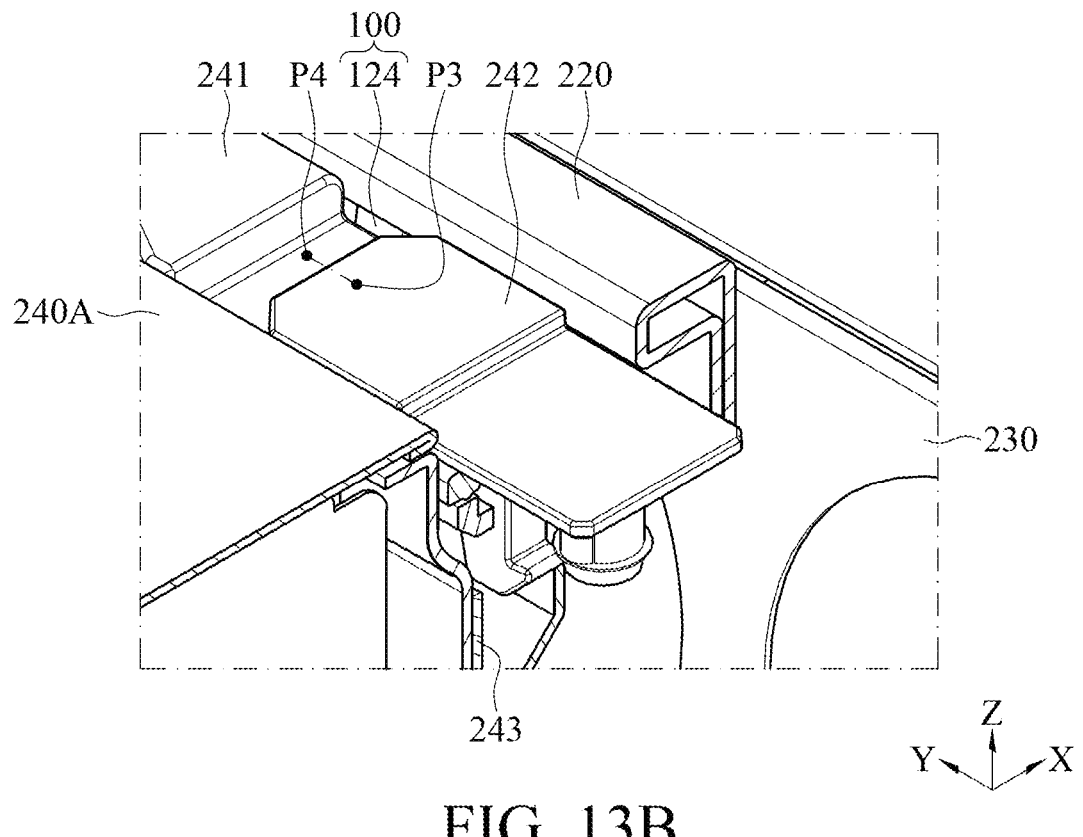
FIG. 13B illustrates an enlarged partial view of the region 13B of the computer after the assembly of the computer in FIG. 13A, in order to show the locking-unlocking device of the second embodiment, adjacent components are sectioned along the line X-X, wherein the assembling of the base module and the separation member shown in FIG. 13A is completed.

Please refer to FIG. 13A and FIG. 13B. FIG. 13A illustrates a partial exploded view of a computer comprising the locking-unlocking device of the second embodiment, where the base module and the separation member are illustrated separately. FIG. 13B illustrates an enlarged partial view of the region 13B of the computer after the assembly of the computer in FIG. 13A, in order to show the locking-unlocking device of the second embodiment, adjacent components are sectioned along the line X-X in FIG. 13B. Specifically, in this embodiment, the assembling of the base module 230 and the separation member 220 shown in FIG. 13B is already completed. The computer 200 comprises a chassis 210, a functional device 240A, and the locking-unlocking device 100. The functional device 240A is accommodated in the chassis 210 and comprises a releasing member 242, the releasing member 242 is capable of being operated, and the releasing member 242 is at least capable of being slid to a locked position P3 or a released position P4. The locking-unlocking device 100 is directly or indirectly arranged at a portion of the chassis 210 adjacent to the releasing member 242.

Figure 16:
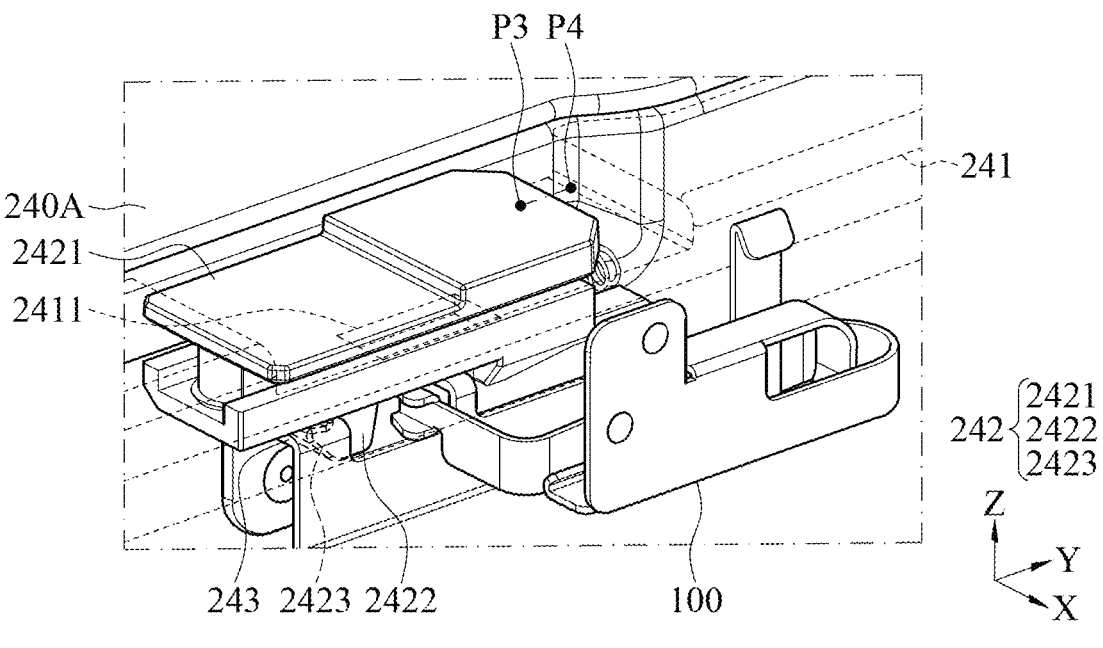
FIG. 16 illustrates a partial perspective schematic view of the snap part, the locking-unlocking device, the handle, and the releasing member in which the releasing member is at the locked position, and the viewing angle of FIG. 16 is along a direction from the right rear side of the chassis toward the locking-unlocking device shown in FIG. 13A.
Figure 17:
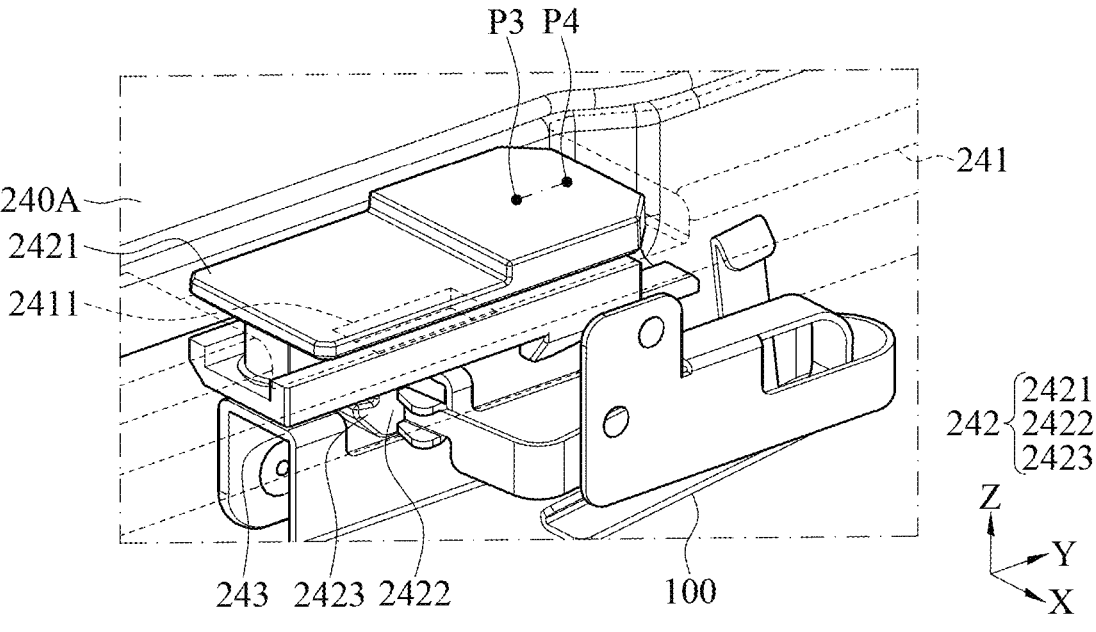
FIG. 17 illustrates a partial perspective schematic view of the snap part, the locking-unlocking device, the handle, and the releasing member in which the releasing member is at the released position, and the viewing angle of FIG. 17 is identical to the viewing angle of FIG. 16.

In some embodiments, the computer 200 further comprises a base module 230 and a front module 240, and the chassis 210 further comprises a separation member 220 (in FIG. 13A, only the component in the base module 230 which is closest to the separation member 220, for instance the fan component, is illustrated for example, but the instant disclosure is not limited thereto). The separation member 220 is fixed on the chassis 210 to divide the chassis 210 into a first space S1 and a second space S2. The base module 230 is arranged in the first space S1, and the front module 240 is arranged in the second space S2. The base module 230 has a pushing member 231, for example, the front edge of an upper cover of the base module 230. The functional device 240A is in the front module 240, and the functional device 240A further comprises a handle 241. For example, the functional device 240A may be a storage unit comprising, for example, HDD or SDRAM arrays or may be a GPU high speed computing unit, and the functional device 240A is capable of being lifted upwards using the handle 241, so that the replacement or maintenance of the functional device 240A can be achieved conveniently. The handle 241 is pivotally rotatable, and the releasing member 242 is slidably arranged on the handle 241 to be operated by a user to be at the locked position P3 (as the position of the releasing member 242 shown in FIG. 16) or the released position P4 (as the position of the releasing member 242 shown in FIG. 17). When the releasing member 242 is normally at the locked position P3, the handle 241 is locked and is not capable of being lifted upwards by the user, so that the functional device 240A is locked within the chassis 210. On the other hand, when the releasing member 242 is pushed to the released position P4, the handle 241 is unlocked and is capable of being lifted upwards by the user, so that the functional device 240A is released and is capable of leaving the chassis 210. Please refer to FIG. 16. FIG. 16 illustrates the positional relationship among the locking-unlocking device 100, the handle 241, and the releasing member 242 in which the base module 230 and the separation member 220 are not shown, and the viewing angle of FIG. 16 is along a direction from the right rear side of the chassis 210 toward the locking-unlocking device 100 shown in FIG. 13A. In FIG. 16, the releasing member 242 is at the locked position P3. Please refer to FIG. 17. FIG. 17 illustrates the positional relationship among the locking-unlocking device 100, the handle 241, and the releasing member 242 in which the base module 230 and the separation member 220 are not shown, and the viewing angle of FIG. 17 is identical to the viewing angle of FIG. 16. In FIG. 17, the releasing member 242 is at the released position P4.

Figure 14:
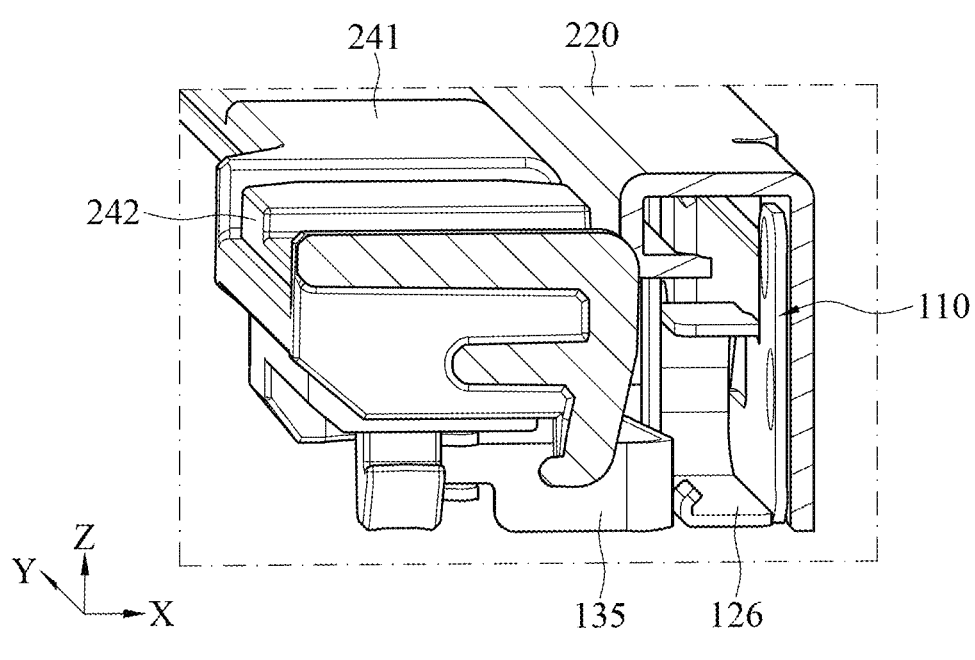
FIG. 14 illustrates a partial perspective sectional view of the separation member, the locking-unlocking device, the handle, and the releasing member sectioned along the line X-X shown in FIG. 13A.

Please refer to FIG. 14. In this embodiment, the locking-unlocking device 100 is taken the locking-unlocking device 100 of the second embodiment as an example. The fixing member 110 of the locking-unlocking device 100 is directly or indirectly fixed on the chassis 210. Specifically, in this embodiment, the fixing member 110 is fixed on the separation member 220. In some embodiments, the fixing member 110 of the locking-unlocking device 100 leans against separation member 220. Accordingly, the position of the locking-unlocking device 100 is sufficiently concealed and safe, thereby preventing a user from contacting or unlocking the locking-unlocking device 100 manually. Moreover, the locking-unlocking device 100 is a lightweight and tiny structure, therefore the locking-unlocking device 100 can prevent the computer 200 from being operated improperly without modifying existing product designs and varying product molds.

Figure 15:
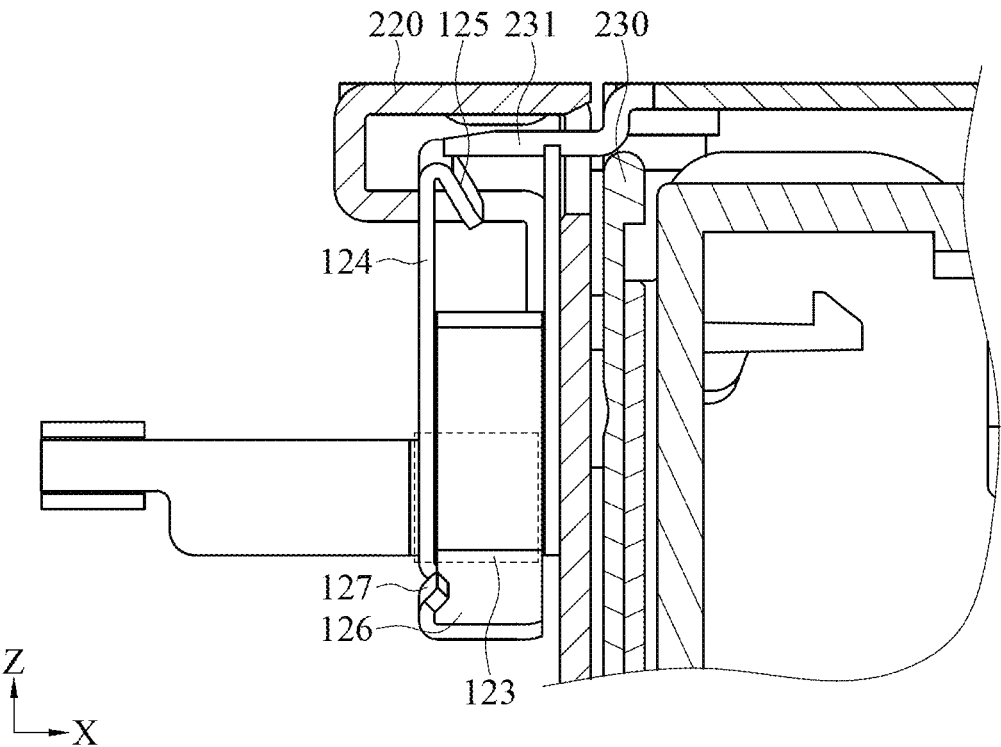
FIG. 15 illustrates a partial perspective sectional view of the base module, the separation member, and the locking-unlocking device sectioned along the line X-X shown in FIG. 13A.

Please then refer to FIG. 15. In this embodiment, the pushing member 231 of the base module 230 pushes the movable part 123 of the locking-unlocking device 100 downwards to allow the stopping part 126 to be moved toward the −Z direction (that is, to leave the stopping space A). In some embodiments, when the base module 230 is placing in the first space S1, the pushing member 231 pushes the movable part 123 of the locking-unlocking device 100 downwards to allow the movable part 123 to be moved toward the −Z direction (in FIG. 15, downward direction). Specifically, in the embodiment shown in FIG. 15, the pushing member 231 pushes the guiding inclined surface 125 of the second protrusion part 124 of the locking-unlocking device 100 toward the −X direction (in FIG. 15, leftward direction). Therefore, through the guiding of the guiding inclined surface 125, the force toward the −X direction provided by the pushing member 231 can be split into the component force of the force toward the −X direction and the component force of the force toward the −Z direction, and the component force of the force toward the −Z direction received by the guiding inclined surface 125 thus drives the second protrusion part 124 and the movable part 123 to be moved toward the −Z direction.

In some embodiments, the pushing member 231 is a structure in the base module 230 in which the pushing member 231 is embedded into the separation member 220 and pushes the movable part 123 of the locking-unlocking device 100. In some embodiments, the pushing member 231 may be an element or a portion of the upper cover or the fan. For example, as shown in FIG. 13A, the pushing member 231 may be the front edge of the upper cover of the base module 230.

In some embodiments, the base module 230 and/or the front module 240 may be a rectangular box structure.

Please refer to FIG. 13A again. In some embodiments, the handle 241 is of a U-shaped structure, and two ends 241a, 241b of the handle 241 are pivotally connected to the left and right sides of the functional device 240A, and the handle 241 is adapted to pull up the functional device 240A when the handle 241 is released. Specifically, in some embodiments, one or both of the two ends 241a, 241b of the handle 241 correspond to a handle locking device arranged at the left and right sides of the front module 240 to lock the handle 241 or to release the handle 241. The handle 241 includes a left section, a middle section, and a right section, the releasing member 242 is slidably arranged on a middle portion of the middle section of the handle 241, and the releasing member 242 is linked to the handle locking device to lock the handle 241 or release the handle 241. It is noted that, because the handle locking device is known to the art and is not directly related to the locking-unlocking device 100 according to the instant disclosure, the description of the handle locking device is thus omitted; as long as the handle locking device can provide the function as shown in FIG. 16 and FIG. 17, such handle locking device can be used along with the handle. That is, in some embodiments, when the releasing member 242 is at the locked position P3 (the position of the releasing member 242 shown in FIG. 16), the handle 241 is not capable of being pulled up, and thus the functional device 240A is not capable of being lifted upwards using the handle 241; when the releasing member 242 is at the released position P4 (the position of the releasing member 242 shown in FIG. 17), the handle 241 is capable of being pulled up, and thus the functional device 240A is capable of being lifted upwards using the handle 241.

In some embodiments, the releasing member 242 comprises a slidable part 2421 and a hook part 2422. The slidable part 2421 is slidably arranged on the through hole 2411 of the handle 241. The hook part 2422 is connected to and perpendicular to the slidable part 2421, and an end portion of the hook part 2422 has a protrusion part 2423. In some embodiments, when the releasing member 242 is at the locked position P3, the protrusion part 2423 is hooked into the snap part 243 at the rear side of the front module 240, so that the handle 241 is not capable of being pulled up; when the releasing member 242 is at the released position P4, the protrusion part 2423 is detached from the snap part 243 at the rear side of the front module 240, so that the handle 241 is capable of being pulled up. However, it is noted that, the descriptions regarding the releasing member 242 and the lock-release structure mated with the releasing member 242 are merely provided to describe the structure of the computer 200 in which the locking-unlocking device 100 according to the instant disclosure can be applied, and such descriptions are not used to limit the object to be applied with the locking-unlocking device 100 according to the instant disclosure. Furthermore, it is not the case that only computers provided with the aforementioned lock-release structure can be utilized by the locking-unlocking device 100 according to the instant disclosure.

Figure 18:
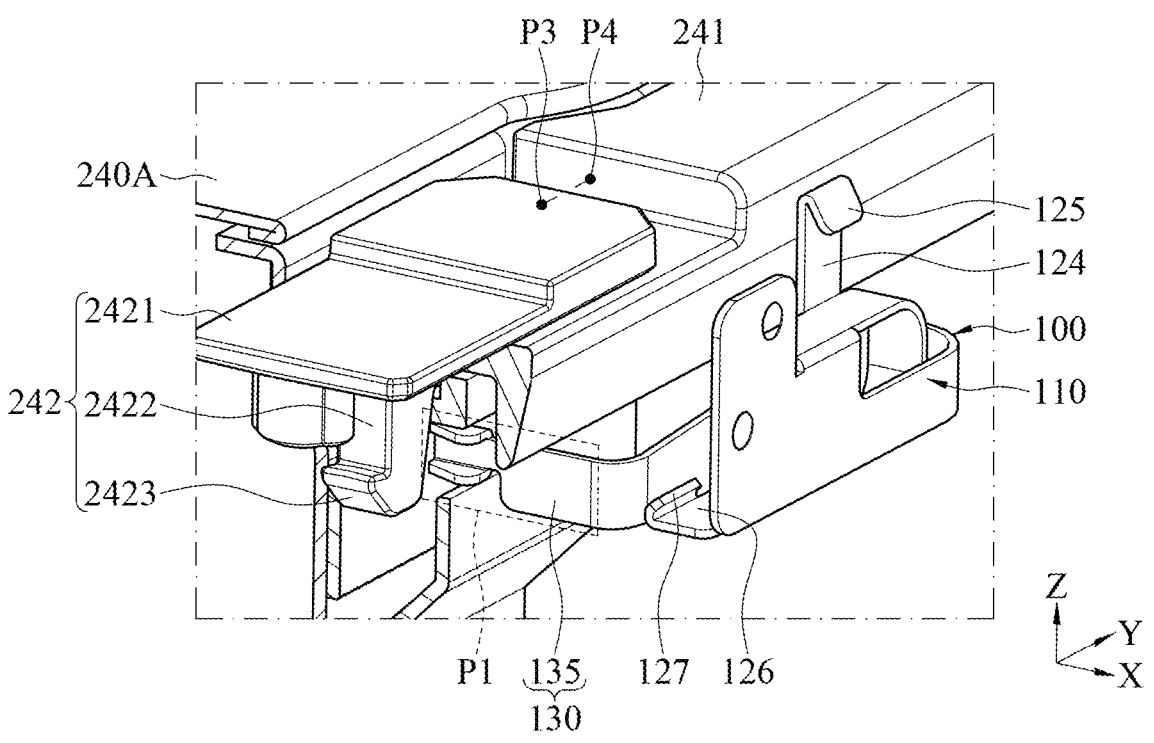
FIG. 18 illustrates a partial perspective schematic view of the snap part, the locking-unlocking device, the handle, and the releasing member in which the locking-unlocking device is under the normal state, and the viewing angle of FIG. 18 is slightly close to the viewing angle of FIG. 16.
Figure 19:
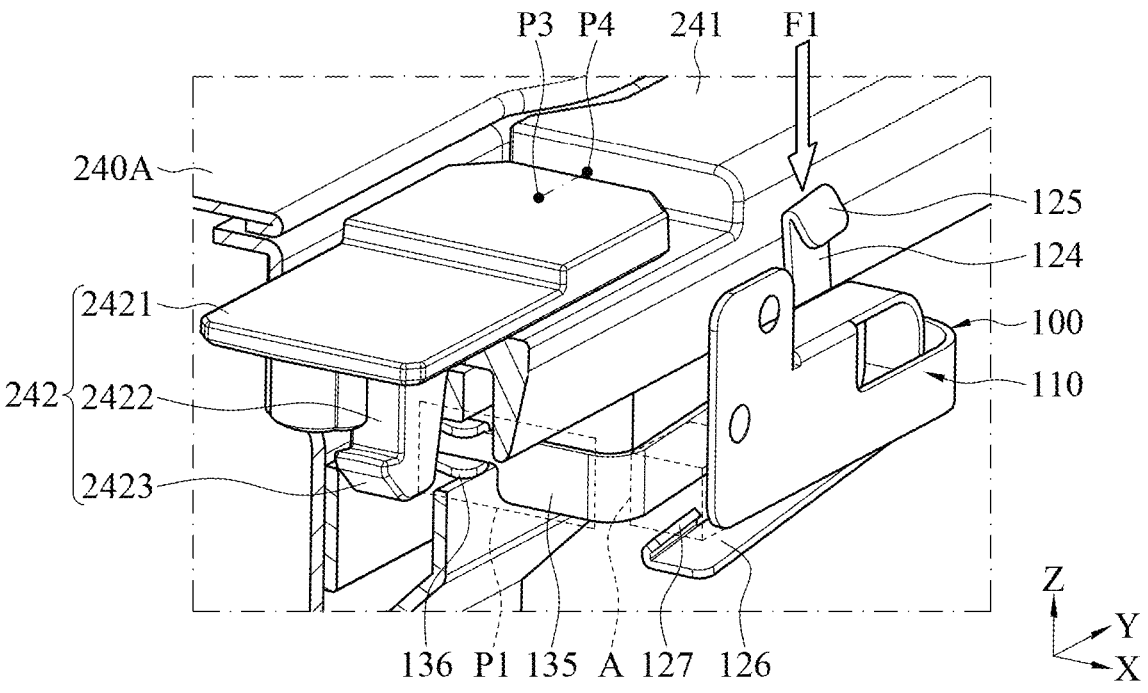
FIG. 19 illustrates a partial perspective schematic view of the snap part, the locking-unlocking device, the handle, and the releasing member in which the locking-unlocking device is entering the unlocked state, and the viewing angle of FIG. 19 is identical to the viewing angle of FIG. 18.
Figure 20:
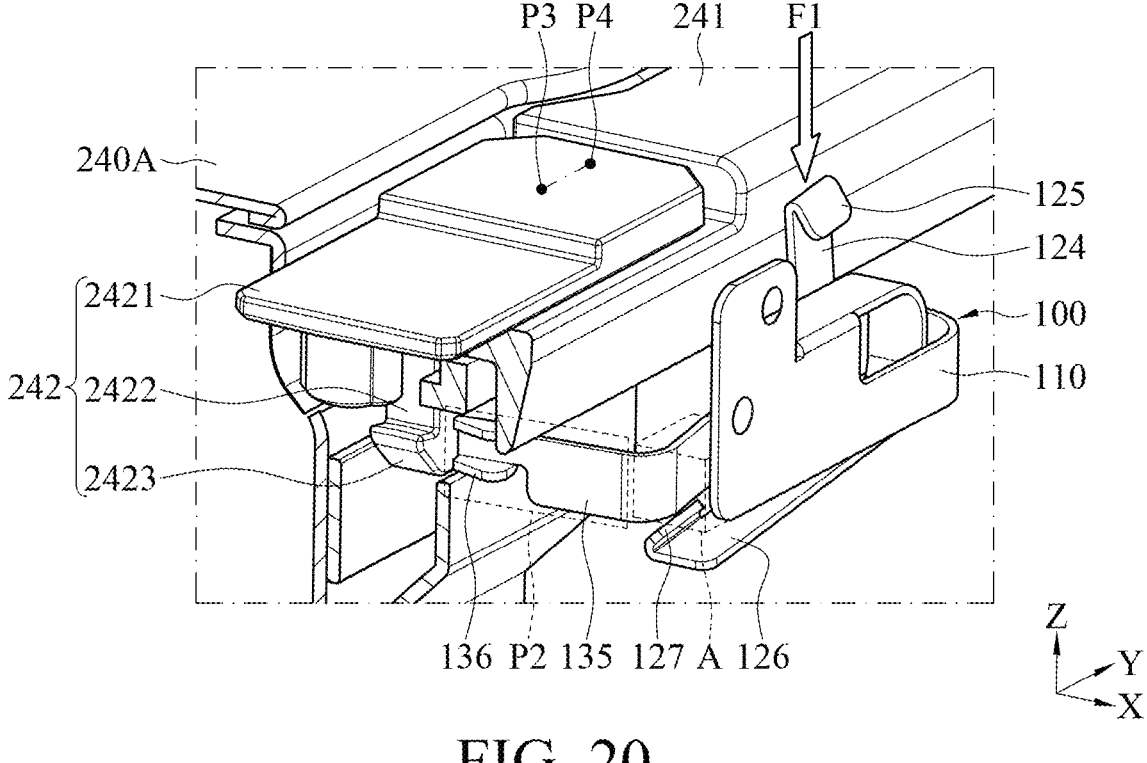
FIG. 20 illustrates a partial perspective schematic view of the snap part, the locking-unlocking device, the handle, and the releasing member in which the locking-unlocking device is under the unlocked state, and the viewing angle of FIG. 20 is identical to the viewing angle of FIG. 18.

Next, please refer to FIG. 18 to FIG. 20. In the following paragraphs, the operation of the locking-unlocking device 100 according to the second embodiment is used to illustrate the locked state and the unlocked state of the locking-unlocking device 100. The viewing angle of FIG. 18 to FIG. 20 is slightly different from the viewing angle of FIG. 16, so that the positions of the components shown in the drawings can be realized clearly. FIG. 18 to FIG. 20 illustrate the positional relationship among the locking-unlocking device 100, the handle 241, and the releasing member 242 in which the base module 230 and the separation member 220 are not shown.

Please refer to FIG. 18. The locked state of the locking-unlocking device 100 is the normal state (the state that the pushing member 231 does not push the locking-unlocking device 100). The locking part 135 is at the first position P1 (for example, the position of the locking part 135 shown in FIG. 18; the locking part 135 is inserted into and at a position in front of the hook part 2422 in which the locking part 135 blocks the hooking part 2422 from being moved toward the +Y direction, and a gap may be between the locking part 135 and the hook part 2422 or the locking part 135 may directly contact the hook part 2422). Under this state, the locking part 135 is interfered with a position in front of the movement path of the releasing member 242 (between the locked position P3 and the released position P4 of the releasing member 242). Therefore, even though the user pushes the releasing member 242 toward the released position P4 and allows the hook part 2422 to push the guiding part 136 of the locking part 135, because the stopping part 126 of the stopping member 120 is in the stopping space A and the locking part 135 is not capable of being moved toward the +X direction, the releasing member 242 can only be retained at the locked position P3 and is not capable of entering the released position P4. When the releasing member 242 is at the locked position P3, the handle 241 is not capable of being pulled up, and thus the functional device 240A is not capable of being lifted upwards using the handle 241. Accordingly, the configuration of the locking-unlocking device 100 ensures that the chassis 210 of the computer 200 can be prevent from being damaged due to improper operation of the chassis 210.

In some embodiments, the side surface of the stopping part 126 (one side of the stopping part 126 adjacent to the fixing member 110) is moved close to or leans against the fixing member 100. Therefore, even though the stopping part 126 is applied with the force toward the +X direction, the stopping part 126 is still not capable of being moved toward the direction toward the fixing member 110 (in FIG. 18, the direction is the +X direction, rightward direction). The locking-unlocking member 130 is moved close to or leans against the other side surface of the stopping part 126 (one side of the stopping part 126 away from the fixing member 110). Therefore, even though the locking-unlocking member 130 is applied with the force toward the +X direction, the locking-unlocking member 130 is still not capable of being moved toward the direction toward the fixing member 110. Under this state, the protrusion part 2423 is hooked into the snap part 243 at the rear side of the front module 240 (as shown in FIG. 16, the protrusion part 2423 is at the –Z direction relative to the snap part 243, so that the releasing member 242 and the handle 241 are not capable of being pulled toward the +Z direction by the user), the locking part 135 is in front of the movement path of the hook part 2422 (namely, the path of the hook part 2422 toward the +Y direction). Therefore, the locking part 135 blocks the protrusion part 2423 from leaving the snap part 243 at the rear side of the front module 240, so that the releasing member 242 is retained at the locked position P3 and is not capable of entering the released position P4. Hence, the handle 241 is not capable of being pulled up, and the functional device 240A is not capable of being lifted upwards using the handle 241. In some embodiments, the locking-unlocking member 130 leans against the first protrusion part 127 to allow the locking-unlocking member 130 to be not capable of being moved toward the fixing member 110. In some embodiments, the snap part 243 is fixed at the rear side of the front module 240.

Please refer to FIG. 19. When the pushing member 231 provides the external force F1 to push the movable part 123 downwards (to prevent the figure from being too complicated, the pushing member 231 is not shown in FIG. 19; the configuration of the pushing member 231 can be referred to FIG. 15) (for example, when the base module 230 is installed and fixed in the first space S1), the stopping part

126 leaves the stopping space A to allow the locking-unlocking device 100 to be entering the unlocked state. In some embodiments, the first protrusion part 127 also leaves the stopping space A. Specifically, in some embodiments, the movable part 123 is applied with the external force F1 to be moved toward the –Z direction (in FIG. 19, downward direction), and the movable part 123 thus drives the stopping part 126 to be moved toward the –Z direction, thereby allowing the stopping part 126 to leave the stopping space A. As mentioned above, FIG. 19 illustrates a state in which the base module 230 and the front module 240 are already installed and fixed on the chassis 210 of the computer 200. Under this state, because the chassis 210 and the base module 230 are already assembled with each other steadily (for example fixed by multiple screws), the overall robustness and structural strength of the computer 200 (including the separation member 220) is greater (as compared with the overall robustness and structural strength of the computer 200 in which the base module 230 and the front module 240 are not assembled in the chassis 210).

Please refer to FIG. 20. When the locking-unlocking device 100 is under the unlocked state, the locking part 135 is capable of being moved from the first position P1 to the second position P2 (the position of the locking part 135 shown in FIG. 20). Under this state, the locking part 135 partially or completely leaves the movement path of the hook part 2422. In the case that the locking part 135 partially leaves the movement path of the hook part 2422, when the user moves the releasing member 242 from the locked position P3 toward the released position P4, the hook part 2422 of the releasing member 242 provides the second external force (the force toward the +X direction) to push the guiding part 136 of the locking part 135, so that the locking part 135 is moved from the first position P1 to the second position P2 (that is, the locking part 135 is moved toward the +X direction). In any case, as long as the locking part 135 at the second position P2 leaves the movement path of the releasing member 242 (between the locked position P3 and the released position P4 of the releasing member 242), the releasing member 242 is capable of being operated to be moved from the locked position P3 to the released position P4.

In some embodiments, the locking part 135 may have the flexibility to be moved toward the fixing member 110 (in FIG. 20, the +X direction, rightward direction) (as shown in FIG. 19 and FIG. 20). Under this state, when the protrusion 2423 leaves the snap part 243 at the rear side of the front module 240, the releasing member 242 pushes the locking part 135 to be moved toward the second position P2. When the locking part 135 at the second position P2 leaves the movement path of the hook part 2422, the protrusion 2423 is capable of leaving the snap part 243 at the rear side of the front module 240, and the releasing member 242 is capable of being moved from the locked position P3 to the released position P4. Therefore, the handle 241 is capable of being pulled up, and thus the functional device 240A is capable of being lifted upwards using the handle 241. In this embodiment, the configuration of the locking-unlocking device 100 ensures that the stopping member 120 will not be triggered to unlock the locking-unlocking member 130 unless the assembling of the base module 230 and the assembling of the pushing member 231 are both completed. Therefore, the handle 241 is capable of being pulled up, and thus the functional device 240A is capable of being lifted upwards using the handle 241.

In some embodiments, the guiding part 136 is at the free end of the locking part 135 and corresponds to the hook part 2422. When the releasing member 242 is moved from the locked position P3 to the released position P4, if the locking part 135 does not completely leaves the movement path of the hook part 2422, the hook part 2422 contacts the guiding part 136, and thus through the guiding between the inclined surface of the guiding part 136 and the hook part 2422, the locking part 135 is driven to be moved from the first position P1 to the second position P2.

Based on the above, the locking-unlocking device according to one or some embodiments of the instant disclosure, in an application scenario, can prevent the server-type computer product from being improperly operated when the assembling of the server-type computer product is not completed, thereby improving current encountering technical issues. However, based on the above, a person having ordinary skills in the art can realize that, the locking-unlocking device of the instant disclosure may be applied to other electronic appliances, electronic products, or devices. In particular, the locking-unlocking device of the instant disclosure may be applied to a product or a device to prevent a pushable switch element (similar to the releasing member) of the product or the device from being pushed improperly or prevent the pushable switch element from being pushed improperly before a predecessor procedure is executed. In the embodiments of the instant disclosure, the locking-unlocking device may be integrally formed as a unitary member made of metal, plastic, or composite materials. Therefore, the development and manufacturing costs of the components of the locking-unlocking device can be reduced. Moreover, the locking-unlocking device is a lightweight and tiny structure and can be assembled on the product or the device easily. Hence, the locking-unlocking device can prevent the server from being operated improperly without modifying or varying existing server mechanical designs.

What is claimed is:

1. A locking-unlocking device comprising:
a fixing member;
a stopping member comprising:
a first connection part, wherein at least one end of the first connection part is connected to the fixing member;
a movable part, wherein at least one end of the movable part is connected to the first connection part, and the movable part is capable of being moved toward a first direction to a limited extent when the movable part is applied with a first external force; and
a stopping part, wherein at least one end of the stopping part is connected to the movable part, and the stopping part is normally in a stopping space; when the movable part is applied with the first external force to be moved toward the first direction, the stopping part leaves the stopping space; and
a locking-unlocking member comprising:
a second connection part, wherein at least one of two ends of the second connection part is connected to the fixing member; and
a locking part, wherein at least one end of the locking part is connected to the other end of the second connection part, and the locking part is capable of being moved toward a second direction to a limited extent when the locking part is applied with a second external force;
wherein when the stopping part is in the stopping space, the locking-unlocking member is blocked by the stopping part and not capable of being moved toward the second direction to enter the stopping space; when the stopping part leaves the stopping space, the locking-unlocking member is capable of being moved toward the second direction to enter the stopping space.

2. The locking-unlocking device according to claim 1, wherein the stopping member is a first cantilever element, a fixed end of the first cantilever element is the first connection part, a free end of the first cantilever element is the stopping part, and the movable part is between the first connection part and the stopping part to be applied with the first external force.

3. The locking-unlocking device according to claim 2, wherein the stopping member further comprises a second protrusion part, and the second protrusion part outwards protrudes from the movable part.

4. The locking-unlocking device according to claim 3, wherein the first cantilever element further comprises a first bent part, the first bent part is between the first connection part and the movable part to allow the movable part to be flexibly moved.

5. The locking-unlocking device according to claim 2, wherein the locking-unlocking member is a second cantilever element, a fixed end of the second cantilever element is the second connection part, and a free end of the second cantilever element is the locking part.

6. The locking-unlocking device according to claim 5, wherein the second cantilever element further comprises a second bent part, and the second bent part is between the second connection part and the locking part.

7. The locking-unlocking device according to claim 6, wherein the second cantilever element further comprises an interference section, the interference section is between the second bent part and the locking part and is capable of being moved flexibly, and the locking part is capable of driving the interference section to be moved toward the second direction when the locking part is applied with the second external force.

8. The locking-unlocking device according to claim 7, wherein the second cantilever element further comprises a third bent part, and the third bent part is between the interference section and the locking part.

9. The locking-unlocking device according to claim 1, wherein the fixing member has a first edge and a second edge, the first connection part is connected to the first edge, and the second connection part is connected to the second edge.

10. The locking-unlocking device according to claim 1, wherein the fixing member, the stopping member, and the locking-unlocking member are integrally formed as a unitary member.

11. A computer comprising:
a chassis;
a functional device accommodated in the chassis, wherein the functional device comprises a releasing member, the releasing member is capable of being operated, and the releasing member is at least capable of being slid to a locked position or a released position; and
a locking-unlocking device directly or indirectly arranged at a portion of the chassis adjacent to the releasing member, wherein the locking-unlocking device comprises:
a fixing member directly or indirectly fixed on the chassis;
a stopping member comprising a movable part and a stopping part, wherein at least one end of the stopping part is connected to the movable part, and the stopping part is normally in a stopping space; when the movable part is applied with a first external force to be moved toward a first direction, the stopping part leaves the stopping space; and a locking-unlocking member comprising a locking part, wherein the locking part is capable of being moved toward a second direction when the locking part is applied with a second external force, the locking part is normally interfered with a movement path of the releasing member from the locked position to the released position;

wherein when the stopping part of the stopping member is applied with the first external force to leave the stopping space, the locking part is capable of being moved toward the second direction so that the locking part is no longer interfered with the movement path of the releasing member to allow the locking-unlocking member to enter the stopping space, thereby allowing the releasing member to be capable of being operated and to be slid from the locked position to the released position.

12. The computer according to claim 11, wherein the functional device further comprises a handle capable of being pivotally rotated, the releasing member is arranged on the handle, and the releasing member is capable of being operated to lock or release the functional device.

13. The computer according to claim 11, wherein the stopping member further comprises:

a first connection part, wherein at least one end of the first connection part is connected to the fixing member, at least one end of the movable part is connected to the first connection part, and the movable part is capable of being moved toward the first direction to a limited extent when the movable part is applied with the first external force.

14. The computer according to claim 13, wherein the stopping member is a first cantilever element, a fixed end of the first cantilever element is the first connection part, a free end of the first cantilever element is the stopping part, and the movable part is between the first connection part and the stopping part to be applied with the first external force.

15. The computer according to claim 11, wherein the locking-unlocking member further comprises:

a second connection part, wherein at least one end of the second connection part is connected to the fixing member, and at least one end of the locking part is connected to the second connection part.

16. The computer according to claim 15, wherein the locking-unlocking member is a second cantilever element, a fixed end of the second cantilever element is the second connection part, and a free end of the second cantilever element is the locking part.

17. The computer according to claim 11, further comprising a pushing member adapted to generate the first external force to subject to the movable part.

18. The computer according to claim 11, wherein the releasing member is adapted to generate the second external force to subject to the locking part when the releasing member is moved along the movement path.

19. The computer according to claim 11, wherein the fixing member has a first edge and a second edge, the first connection part is connected to the first edge, and the second connection part is connected to the second edge.

20. The computer according to claim 11, wherein the fixing member, the stopping member, and the locking-unlocking member are integrally formed as a unitary member.

* * * * *